(12) United States Patent
Ohkubo et al.

(10) Patent No.: US 8,872,109 B2
(45) Date of Patent: Oct. 28, 2014

(54) HIGH-SPEED PARTICLE DETECTOR FOR DISCRIMINATING CHARGE STATES OF IONS

(75) Inventors: Masataka Ohkubo, Ibaraki (JP); Kouji Suzuki, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 37 days.

(21) Appl. No.: 13/582,658

(22) PCT Filed: Feb. 4, 2011

(86) PCT No.: PCT/JP2011/052407
§ 371 (c)(1),
(2), (4) Date: Sep. 4, 2012

(87) PCT Pub. No.: WO2011/108336
PCT Pub. Date: Sep. 9, 2011

(65) Prior Publication Data
US 2012/0326018 A1      Dec. 27, 2012

(30) Foreign Application Priority Data
Mar. 5, 2010 (JP) ................ P2010-049161

(51) Int. Cl.
*H01J 49/26* (2006.01)
*H01L 39/10* (2006.01)
*H01J 49/02* (2006.01)

(52) U.S. Cl.
CPC .............. *H01L 39/10* (2013.01); *H01J 49/025* (2013.01)
USPC ........................................................ 250/336.2

(58) Field of Classification Search
USPC ........................................................ 250/336.2
See application file for complete search history.

(56) References Cited

U.S. PATENT DOCUMENTS 2,962,681 A * 11/1960 Lentz .......................... 327/373
3,182,209 A *  5/1965 Fruin et al. ................... 327/370

(Continued)

FOREIGN PATENT DOCUMENTS

| EP | 0 597 663 A1 | 5/1994 |
| EP | 1 788 641 A2 | 5/2007 |

(Continued)

OTHER PUBLICATIONS

Casaburi et al., "Subnanosecond time response of large-area superconducting stripline detectors for keV molecular ions," Applied Physics Letters, vol. 94, 212502, 2009, pp. 1-3.

(Continued)

*Primary Examiner* — David Porta
*Assistant Examiner* — Djura Malevic
(74) *Attorney, Agent, or Firm* — Birch, Stewart, Kolasch & Birch, LLP

(57) ABSTRACT

Detected ion charge states are discriminated in a mass spectrograph using a superconducting stripline detector (SSLD) as the detector thereof. A set of mass spectra of the singly charged or higher ions, the doubly charged or higher ions, the triply charged or higher ions (and successively higher ion charge states) are determined by measuring the mass spectra successively while decreasing the bias current flowing through the superconducting stripline detector. Then, the data of singly charged ions alone can be determined by subtracting the data of the doubly charged or higher ions from the data of the singly charged or higher ions. In a similar manner, the data of doubly charged ions alone, the data of triply charged ions alone (and similarly successively multiply charged ions) can also be determined.

11 Claims, 6 Drawing Sheets

(56) References Cited

U.S. PATENT DOCUMENTS

| | | | |
|---|---|---|---|
| 3,691,381 A * | 9/1972 | Kleppner | 250/370.01 |
| 4,851,680 A * | 7/1989 | Oku | 250/336.2 |
| 4,873,482 A * | 10/1989 | Gray | 324/71.4 |
| 5,030,614 A * | 7/1991 | Hollander et al. | 505/161 |
| 5,634,718 A * | 6/1997 | Martinis et al. | 374/32 |
| 5,641,961 A * | 6/1997 | Irwin et al. | 250/336.2 |
| 5,880,468 A * | 3/1999 | Irwin et al. | 250/336.2 |
| 6,211,519 B1 * | 4/2001 | Nam et al. | 250/336.2 |
| 6,365,912 B1 * | 4/2002 | Booth et al. | 257/39 |
| 6,812,464 B1 * | 11/2004 | Sobolewski et al. | 250/336.2 |
| 7,049,593 B2 * | 5/2006 | Sobolewski et al. | 250/336.2 |
| 7,789,557 B2 * | 9/2010 | Tanaka et al. | 374/176 |
| 8,571,615 B2 * | 10/2013 | Hays | 505/191 |
| 2001/0042831 A1 * | 11/2001 | Wood et al. | 250/338.1 |
| 2003/0151376 A9 * | 8/2003 | Cao | 315/291 |
| 2008/0107823 A1 * | 5/2008 | Morii et al. | 427/569 |
| 2008/0197285 A1 * | 8/2008 | Frey et al. | 250/336.2 |
| 2008/0245964 A1 * | 10/2008 | Miles et al. | 250/288 |
| 2008/0272302 A1 * | 11/2008 | Frey et al. | 250/336.2 |
| 2009/0066948 A1 * | 3/2009 | Karpowicz et al. | 356/326 |
| 2009/0072141 A1 * | 3/2009 | Satoh et al. | 250/336.2 |
| 2009/0127460 A1 * | 5/2009 | Frey | 250/336.2 |
| 2009/0184252 A1 * | 7/2009 | Tanaka et al. | 250/370.09 |
| 2009/0236516 A1 | 9/2009 | Kishi et al. | |
| 2009/0317295 A1 * | 12/2009 | Yonesu et al. | 422/29 |
| 2010/0277718 A1 * | 11/2010 | Zhang et al. | 356/51 |

FOREIGN PATENT DOCUMENTS

| | | |
|---|---|---|
| JP | 2004-214293 A | 7/2004 |
| JP | 2005-195552 A | 7/2005 |
| JP | 2007-115556 A | 5/2007 |
| JP | 2009-21478 A | 1/2009 |
| JP | 2009-222664 A | 10/2009 |

OTHER PUBLICATIONS

Shiki at al., "Kinetic-energy-sensitive mass spectrometry for separation of different ions with the same m/z value," Journal of Mass Spectrometry, vol. 43, 2008, pp. 1686-1691.

Suzuki et al., "Time Resolution Improvement of Superconducting NbN Stripline Detectors for Time-of-Flight Mass Spectrometry," Applied Physics Express, vol. 1, 031702, 2008, pp. 1-3.

Zen at al., "1 mm ultrafast superconducting stripline molecule detector," Applied Physics Letters, vol. 95, 172508, 2009, pp. 1-3.

* cited by examiner

HIGH-SPEED PARTICLE DETECTOR FOR DISCRIMINATING CHARGE STATES OF IONS

TECHNICAL FIELD

The present invention relates to a superconducting stripline particle detector that detects arrival of atoms or molecules necessary for mass spectrometry.

BACKGROUND ART

In order to detect particles such as charged particles or biopolymers having kinetic energies, a particle detector is used for converting the arrival of ions into an electric signal. In mass spectrometry, ions are subjected to separation analysis in accordance with the ratio (m/z) of the mass (m) of the particles and the charge number (z) of the ions. In linear type time-of-flight mass spectrometers with the simplest structure, time-of-flight (TOF) of ions is represented as TOF= $(m/2zeV)^{1/2}l$, and m/z can be determined by measuring the TOF. Here, e is the elementary electric charge; V is the acceleration voltage; and l is the flight length. Ion optics system such as a reflectron is used for reducing TOF variation caused by, for example, initial kinetic energy distribution in ionization and acceleration at a constant voltage.

Disadvantageously, the mass spectroscopy, in principle, cannot distinguish different ions that have the same m/z, because ions are separated according to m/z. As a simple example, $N^+$ and $N_2^{2+}$ (m/z=14) cannot be separated. In order to overcome this fundamental problem, particle detectors using superconductivity have been studied. A superconducting tunnel junction (STJ) can measure particle kinetic energies when the detector surface is impacted by a particle with a kinetic energy such as several keV to several ten keV that is adopted by many mass spectrometers. Since the kinetic energy of ions accelerated at a constant voltage is proportional to the charge states of the ions, z can be determined by kinetic energy measurement. As a result, particles such as $N^+$ and $N_2^{2+}$ having the same m/z but having different m can be separated (Non-Patent Document 1).

Nevertheless, the electric pulses that the STJ detectors generate at the time of particle impact have a rise time of about 100 ns and a decay time of several µs. Therefore the pulses have a wide pulse width that is about 3 orders of magnitude longer than the nano-second pulses of microchannel plate (MCP) or secondary electron multiplier (SEM), both of which operate at room temperature for detecting particles. For this reason, it is difficult to achieve a high mass resolution. In addition, an extremely low-temperature environment such as about 1 K or lower is required for the operation of the STJ detectors. Disadvantageously, a large cooling equipment would be required.

A superconducting stripline detector (SSLD) is composed of superconducting thin films processed into fine line patterns (Patent Documents 1 and 2, Non-Patent Documents 2, 3, and 4). In SSLD, electric pulses induced by particle impact reportedly have a rise time of 400 ps to several ns and a decay time of 500 ps to several ten ps, which are faster than STJ. The SSLD detectors, however, cannot perform separation analysis of different ions having the same m/z, because SSLD cannot measure individual particles kinetic energy like STJ.

RELATED DOCUMENT

Patent Document

Patent Document 1: Japanese Patent Application Laid-Open (JP-A) No. 2004-214293

Patent Document 2: Japanese Patent Application Laid-Open (JP-A) No. 2009-21478

Non-Patent Document

Non-Patent Document 1: Shigetomo Shiki, Masahiro Ukibe, Yuki Sato, Shigeo Tomita, Shigeo Hayakawa, and Masataka Ohkubo, J. Mass Spectrometry 43, 1686-1691(2008).
Non-Patent Document 2: Koji Suzuki, Shigehito Miki, Shigetomo Shiki, Zhen Wang, and Masataka Ohkubo, Appl. Phys. Express 1,031702 (2008).
Non-Patent Document 3: A. Casaburi, N. Zen, K. Suzuki, M. Ejrnaes, S. Pagano, R. Cristiano, and M. Ohkubo, Appl. Phys. Lett. 94,212502 (2009).
Non-Patent Document 4: N. Zen, A. Casaburi, S. Shiki, K. Suzuki, M. Ejrnaes, R. Cristiano, and M. Ohkubo, Appl. Phys. Lett. 95,172508 (2009).

SUMMARY OF THE INVENTION

Problems to be Solved by the Invention

An object of the present invention is to enable charge state discrimination by superconducting stripline detectors (SSLDs) that can generate high-speed pulses of nano to several ten nano seconds for particle impact. This enables determination of charge states, which is not possible with conventional mass spectroscopy. As a result, m values for mass peaks are uniquely determined.

Solution for Solving Problems

When particles are accelerated with a constant voltage gradient, the particle kinetic energy is proportional to charge states of ions. For this reason, the energy imparted to the superconducting striplines at the time of impact increases in accordance with the increase in the charge number. We have revealed that the lower limit of the detectable particle kinetic energy is changed by adjustment of bias currents flowing through the superconducting striplines.

According to the present invention, there is provided a particle detector with a superconducting stripline detector that is impacted with particles and counts the particles in accordance with hot spots induced locally in a superconductor by impact of the particles, wherein a range of detectable charge states is selectable.

In the particle detector according to the present invention, the superconducting stripline is arranged in series or in parallel within a sensitive area of a detecting element, and transitions from a superconducting state to a normal state by particle impact, thus causing resistance, thereby resulting in being sensitive to individual particle impact.

In the particle detector according to the present invention, the superconducting stripline allows passage of a bias current lower than a superconducting critical current of the superconducting stripline, that is, a critical current at or above which resistance appears, and selects a detectable particle kinetic energy range by changing the bias current.

In the particle detector according to the present invention, the superconducting striplines are made of a single metal element, a nitride, an oxide, a boride, or other compounds.

In the particle detector according to the present invention, the superconducting stripline is made of a thin film deposited on a substrate and processed into striplines.

Effect of the Invention

The bias current is set to be lower than the superconducting critical current, and the mass spectra are measured sequentially while the bias current is reduced. In the measurement, a set of mass spectra including singly charged ions and more highly charged ions, doubly charged ions and more highly charged ions, triply charged ions and more highly charged ions (and followed by successively ions with higher charge states), are obtained. If the bias current is conversely raised from a low one, a set of mass spectra are obtained in the reverse order. The mass spectra of singly charged ions alone are determined by subtracting a spectrum for doubly charged ions and higher ions from a spectrum for singly charged ions and higher ions. The mass spectra of doubly charged ions alone are determined by subtracting a spectrum for triply charged ions and higher ions from a spectrum for doubly charged ions and higher ions. In a similar manner, mass spectra of multiply charged ion are determined successively.

When a plurality of detectors is arranged and the bias current is changed for each of the individual detectors, the aforesaid set of mass spectra can also be obtained simultaneously.

BRIEF DESCRIPTION OF THE DRAWINGS

FIG. 5($b$) is a view of mass spectrum prepared by using events between O-B (doubly charged and triply charged ions) of FIG. 4; and FIG. 5($c$) is a view of mass spectrum prepared by using events between O-C (doubly charged, singly charged ions, and fragments) of FIG. 4.

DESCRIPTION OF EMBODIMENTS

Figure 1:
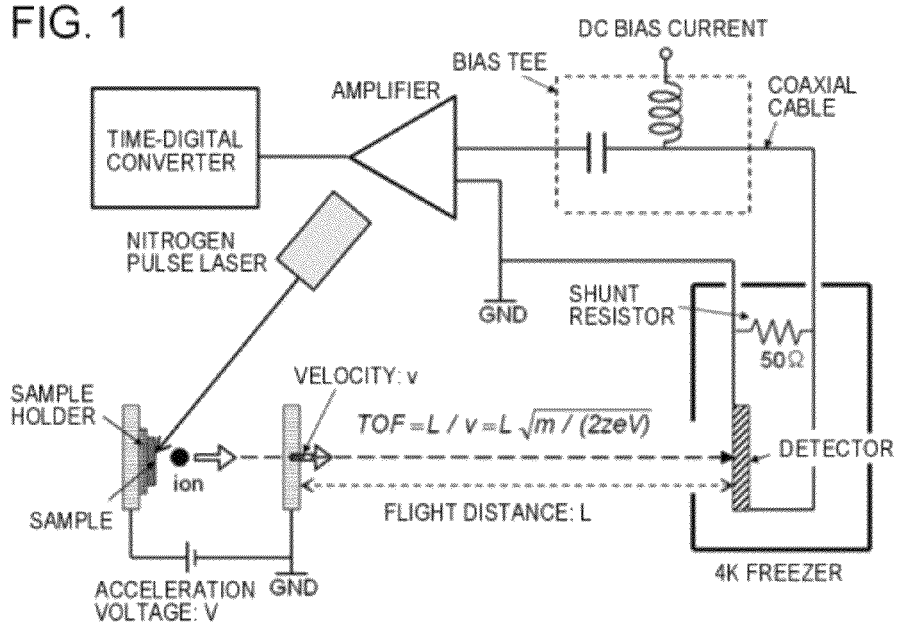
FIG. 1 is a view illustrating an example of use of a particle detector according to the present invention.

FIG. 1 is an example of use combined with matrix-assisted laser desorption ionization method (MALDI). A constant bias current (below or equal to the superconducting critical current) flows through the SSLD via a bias tee. Ions generated by MALDI and accelerated at a constant voltage enter the SSLD to induce superconduction-normal conduction transition. The change in the resistance generates a voltage pulse. The TOF from the start time of the flight till the detection of the ions is converted into a digital value by a time-digital converter and recorded. The lower limit of the detectable particle kinetic energy can be changed by changing the bias current. Thus, a set of mass spectra, such as the spectrum of singly charged or higher ions, the spectrum of doubly charged or higher ions, and the spectrum of triply charged or higher ions, is determined. The set of mass spectra can be determined simultaneously by arranging a plurality of detectors in an array and flowing different bias currents therethrough.

EXAMPLES

Figure 2:
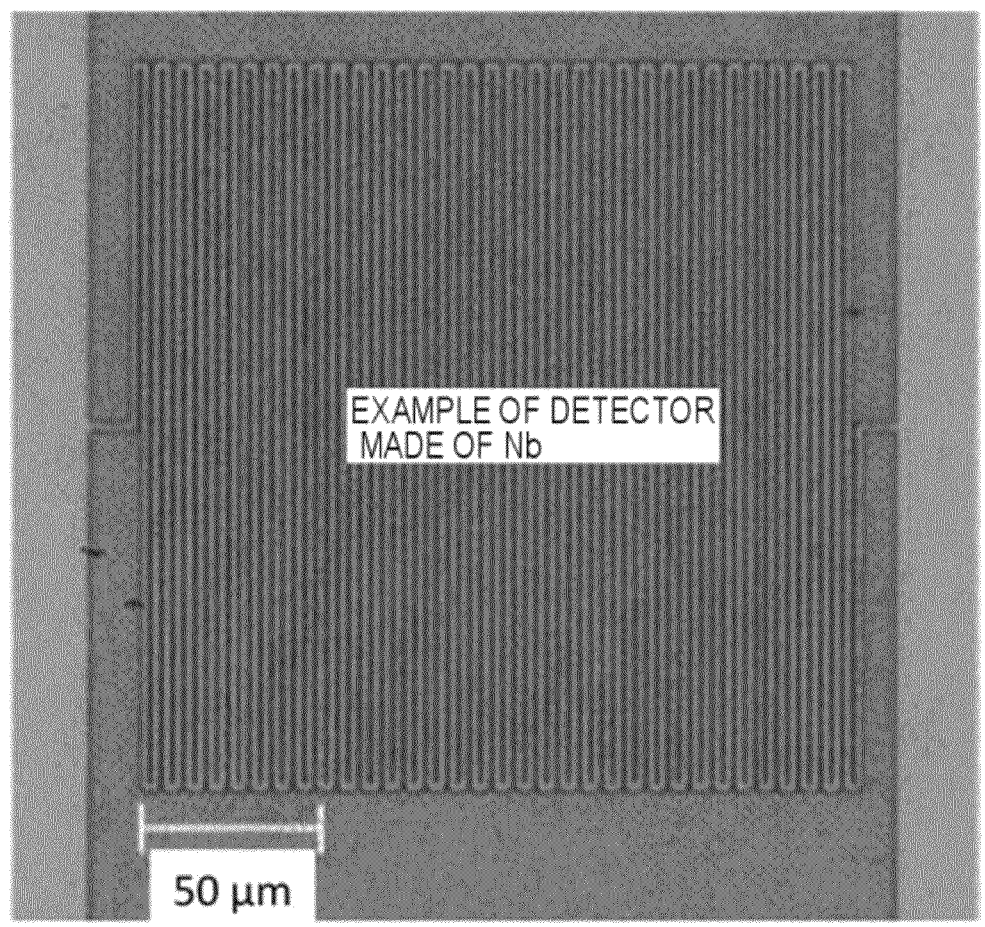
FIG. 2 is a view illustrating an example of a superconducting stripline detector (SSLD).

FIG. 2 shows an example of a superconducting stripline detector (SSLD). Nb is used as a superconductor. A stripline having a scale in FIG. 2 is arranged in a region of 200 μm. FIG. 2 shows one stripline, but a plurality of striplines can be connected in parallel in terms of a circuit. The following data are determined by using an SSLD made of NbN.

Figure 3:
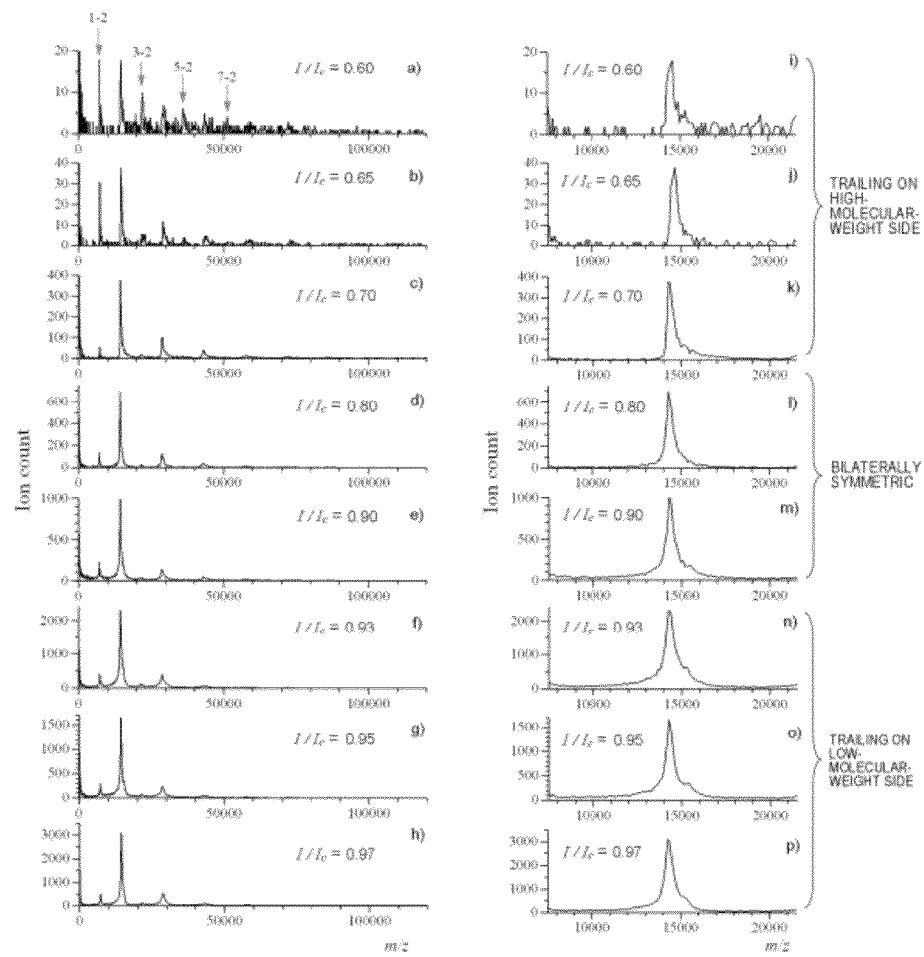
FIG. 3 is a view of mass spectra when the bias current flowing through the superconducting stripline detector (SSLD) is changed.

FIG. 3 shows an example in which the ratio ($I/I_c$) of the bias current to the critical current is changed from 0.6 to 0.97. The measured molecules are lysozyme having a molecular weight of 14,305. FIG. 3($a$) shows that, with $I/I_c$=0.6, mass peaks of doubly charged ions mainly appear. The peak 1-2 is a mass peak of doubly charged ions of the lysozyme monomer; the peak 3-2 is a mass peak of doubly charged ions of the lysozyme trimer; the peak 5-2 is a mass peak of doubly charged ions of the lysozyme pentamer; and the peak 7-2 is a mass peak of doubly charged ions of the lysozyme heptamer. When the bias current is low, the shape of the mass peak trails to the high-molecular weight side. When the bias current is increased, the peak intensity of the singly charged ions increases. When the bias current is high, the shape of the mass peak trails to the low-molecular weight side.

Figure 4:
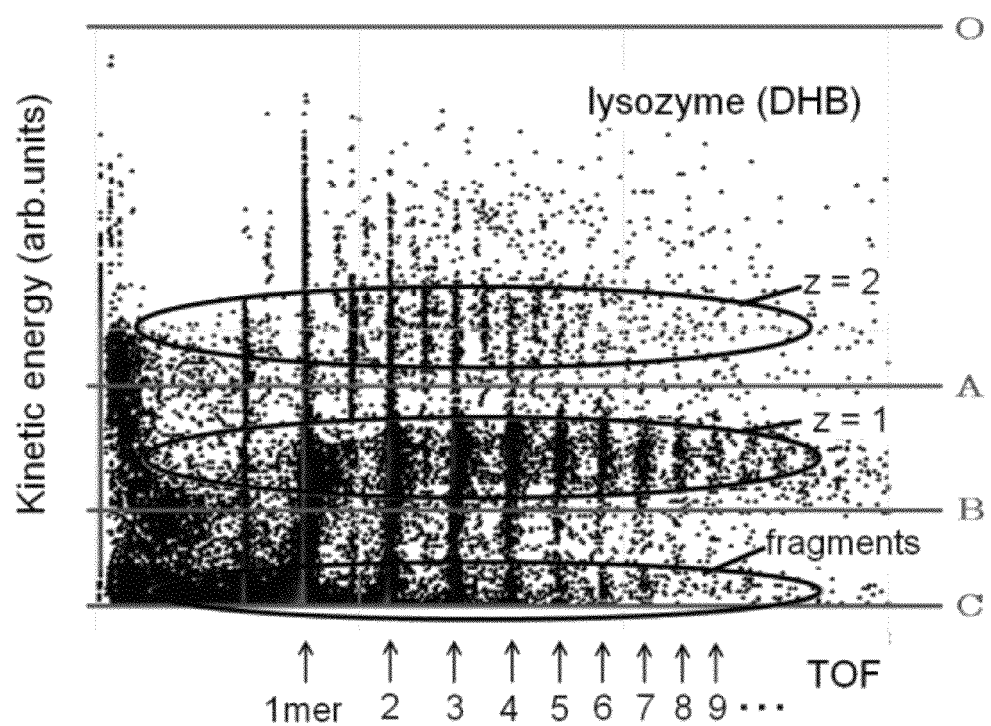
FIG. 4 is a view of distribution of TOF-kinetic energy of particles measured by a superconducting tunnel junction (STJ) detector.
Figure 5:
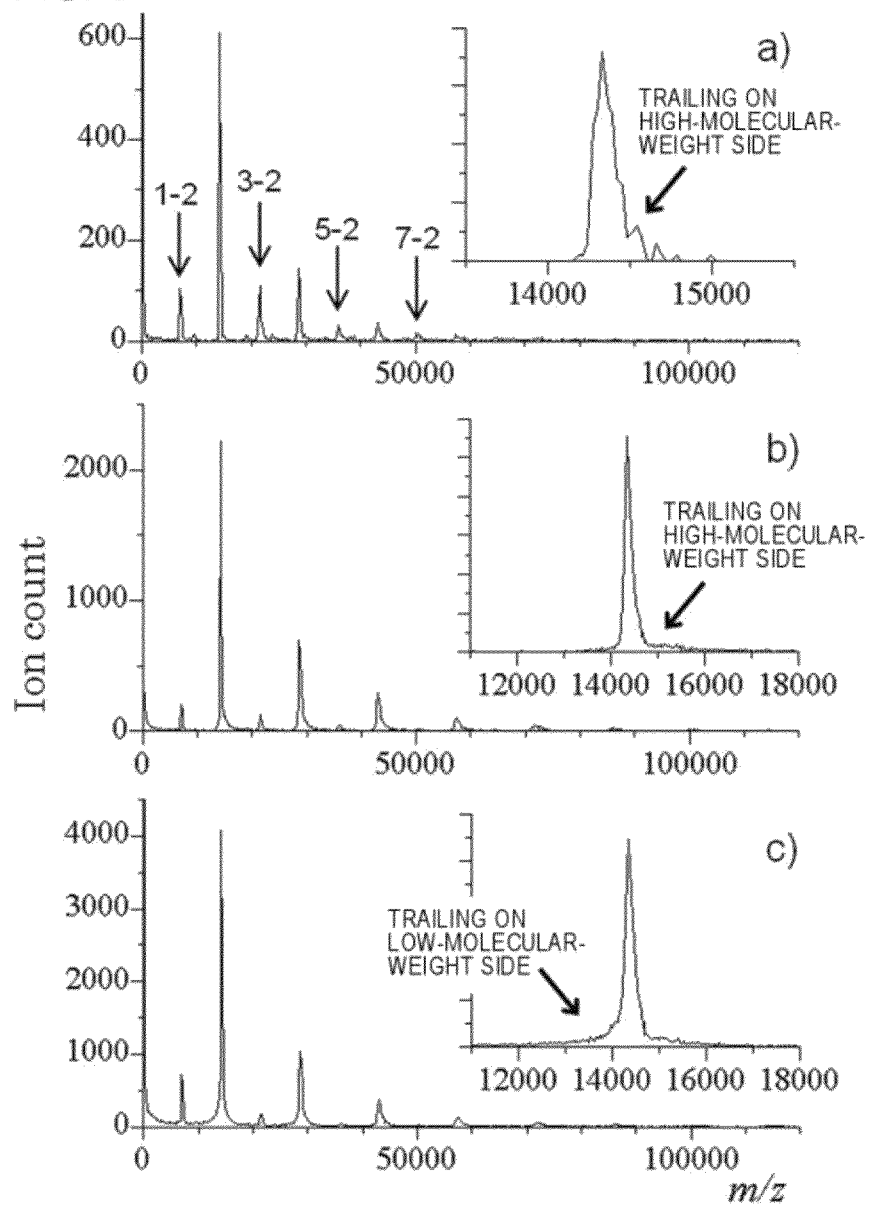
FIG. 5($a$) is a view of mass spectrum prepared by using events between O-A (doubly charged ions) of FIG. 4.

FIG. 4 shows plots of TOF-kinetic energy of the STJ that can measure the kinetic energy for each one of the particles. The region z=2 shows doubly charged ions; the region z=1 shows singly charged ions; and the region "fragment" shows fragments generated by dissociation during the flight. The series of 1mer, 2, 3, 4, 5, 6, 7, 8, 9 shows multimers of lysozyme. As a matrix, 2,5-dihydroxybenzoic acid (DHB) is used. FIG. 5 shows mass spectra constructed from events between O-A, O-B, and O-C. The peak 1-2 is a mass peak of doubly charged ions of the lysozyme monomer; the peak 3-2 is a mass peak of doubly charged ions of the lysozyme trimer; the peak 5-2 is a mass peak of doubly charged ions of the lysozyme pentamer; and the peak 7-2 is a mass peak of doubly charged ions of the lysozyme heptamer. In comparison with FIG. 3, the trail to the high-molecular-weight side and the low-molecular-weight side and the change in the peak intensity of univalent ions and bivalent ions show that the lower limit of kinetic energy detection of the SSLD goes down as A, B, and C of FIG. 4 when the bias current flowing through the SSLD is increased.

Figure 6:
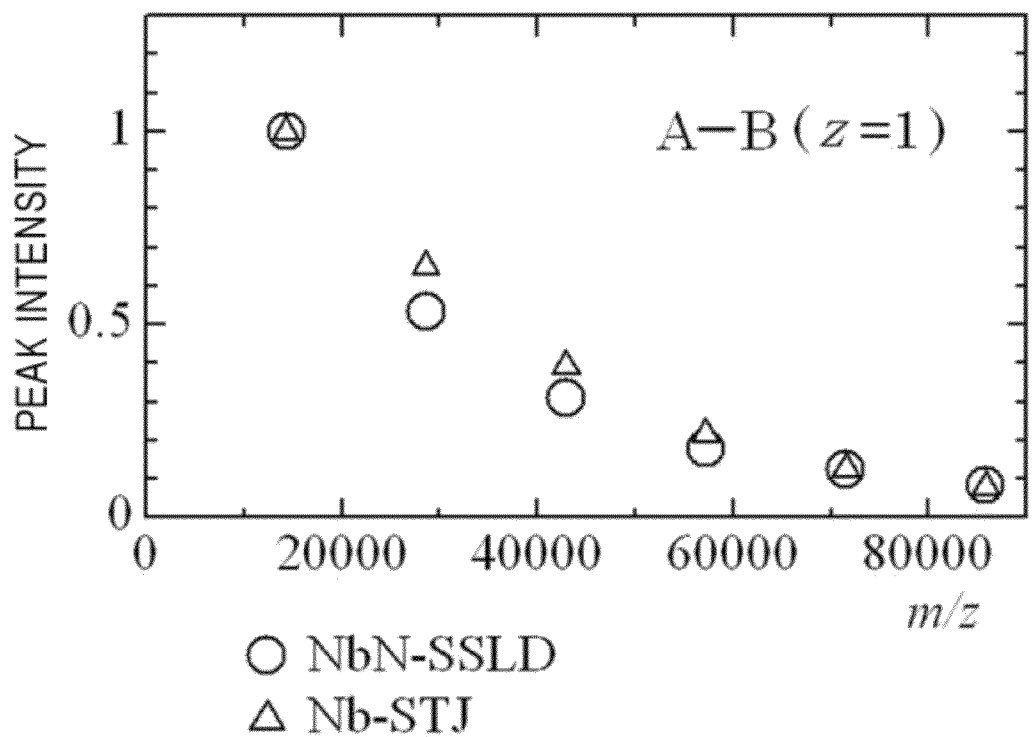
FIG. 6 is a view of comparison between the relative intensity values of the charge state discrimination by the superconducting stripline detector (SSLD) and the relative intensity values of the charge state discrimination by the superconducting tunnel junction (STJ), showing a relative peak intensity comparison for singly charged ions in the superconducting tunnel junction (STJ) and the superconducting stripline detector (SSLD).

FIG. 6 shows relative intensity values of singly charged ion mass peaks for the event between A-B in the distribution diagram of STJ of FIG. 4 and the relative intensity values measured by SSLD. The relative intensity values of SSLD were calculated by subtracting the data at $I/I_c$=0.65 (FIG. 3($b$)) from the data at $I/I_c$=0.70 (FIG. 3($c$)). The relative peak intensity values of STJ and SSLD coincide well. This shows that charge states can be discriminated by SSLD, and a mass spectrum only for singly charged ions can be obtained. FIG. 3($b$) corresponds to a mass spectrum of the doubly charged ions and more highly charged ions, and FIG. 3($c$) corresponds to a spectrum of the singly charged ions and more highly charged ions. FIG. 3($h$) corresponds to a mass spectrum in which the fragments are detected in addition to the intact ions having all charge states.

The invention claimed is:

1. A particle detector with a superconducting stripline detector that is impacted with multiple particles and counts the multiple particles in accordance with hot spots induced locally in a superconductor by an impact of the particles, wherein a detectable range of charge states is selectable, wherein the superconducting stripline detector includes a superconducting stripline that is adapted to allow passage of a bias current that is lower than a superconducting critical current of the superconducting stripline, wherein the critical current is a current at or above which a resistance appears, and wherein the bias current selects a detectable particle kinetic energy range by changing the bias current.

2. The particle detector according to claim 1, wherein the superconducting stripline is arranged in series or in parallel within a sensitive area of a detecting element, and the superconducting stripline is adapted to transition from a superconducting state to a normal state by the impact of the particles, thus causing the resistance, thereby causing each the superconducting stripline to be sensitive to the impact of individual ones of the particles.

3. The particle detector according to claim 1, wherein the superconducting stripline is made of a single metal element, a nitride, an oxide, a boride, or other compounds.

4. The particle detector according to claim 3, wherein the superconducting stripline is made of the boride.

5. The particle detector according to claim 1, wherein the superconducting stripline is made of a thin film deposited on a substrate and processed into striplines.

6. The particle detector according to claim 1, wherein the superconducting stripline detector is adapted to detect and select individual ones of the particles from among a group of the multiple particles, in which some of the particles are in a single charged state and others of the particles are in a double charged state, and the superconducting stripline detector is further adapted to detect and select the individual ones of the particles from among the group of the multiple particles, in which still others of the particles are in a triple charged state, and additional ones of the particles are in more multiple charged states.

7. A particle detector with a superconducting stripline detector that is impacted with multiple particles and counts the multiple particles in accordance with hot spots induced locally in a superconductor by an impact of the particles, wherein a detectable range of charge states is selectable, wherein the superconducting stripline detector includes a superconducting stripline that is adapted to allow passage of a bias current that is lower than a superconducting critical current of the superconducting stripline, wherein the critical current is a current at or above which a resistance appears, and wherein the bias current selects a detectable particle kinetic energy range by changing the bias current, wherein the superconducting stripline consists of a single stripline arranged on a flat plane of the detector.

8. The particle detector according to claim 7, wherein the superconducting stripline arranged on the flat plane of the detector has a shape of a rectangle, and the stripline has opposite ends arranged at a mid-section of two opposite sides of the rectangle.

9. The particle detector according to claim 7, wherein the superconducting stripline arranged on the flat plane of the detector has a shape of a square, and the stripline has opposite ends arranged at a mid-section of two opposite sides of the square.

10. The particle detector according to claim 7, wherein the superconducting stripline is made of a boride.

11. The particle detector according to claim 7, wherein the superconducting stripline detector is adapted to detect and select individual ones of the particles from among a group of the multiple particles, in which some of the particles are in a single charged state and others of the particles are in a double charged state.

* * * * *